United States Patent [19]
Werrbach

[11] Patent Number: 5,483,600
[45] Date of Patent: Jan. 9, 1996

[54] WAVE DEPENDENT COMPRESSOR

[75] Inventor: Donn Werrbach, Glendale, Calif.

[73] Assignee: Aphex Systems, Ltd., Sun Valley, Calif.

[21] Appl. No.: 196,296

[22] Filed: Feb. 14, 1994

[51] Int. Cl.⁶ .................................... H03G 7/00
[52] U.S. Cl. .................... 381/106; 381/107; 381/108; 333/14; 455/72
[58] Field of Search .................................... 381/106, 107, 381/108; 333/14; 455/72

[56] References Cited

U.S. PATENT DOCUMENTS 4,430,754  2/1984  Ishigaki ..................................... 455/72

FOREIGN PATENT DOCUMENTS 1044004  9/1960  United Kingdom ...................... 333/14

*Primary Examiner*—Curtis Kuntz
*Assistant Examiner*—Minsun Oh
*Attorney, Agent, or Firm*—Thomas I. Rozsa; Tony D. Chen

[57]  ABSTRACT

An audio compressor using interactive layered time constants to create an easy to use compressor which self adapts to the program characteristics and provides a desirable and pleasing effect over a wide range of audio program material. The audio compressor includes an adaptable filter connected between an output signal path and a control feedback signal path of a voltage control amplifier. The adaptable filter comprises a first resistor-capacitor circuit connected to the output signal path and producing a charging/discharging voltage which is more dependent on a transient peak value of the audio signals and a second resistor-capacitor circuit working under the charging/discharging voltage of the first resistor/capacitor circuit for producing a charging/discharging voltage which is more dependent on an average value of the audio signals. The second resistor-capacitor circuit is connected in series to the first resistor-capacitor circuit for providing a wave dependent control feedback signal to the control feedback signal path which feedback signal is instantaneously and continuously dependent upon both the average and the transient peak value of the audio signals.

33 Claims, 6 Drawing Sheets

WAVE DEPENDENT COMPRESSOR

BACKGROUND OF THE INVENTION

1. Field of the Invention

The present invention relates to the field of audio signal processing technologies. More particularly the present invention relates to the field of audio signal compression technologies.

2. Description of the Prior Art

Audio compression is a widely used method of processing audio signals. Various objectives can be met with the use of suitable audio compression. The word "suitable" is very much a key to this subject because in prior art there have been a great many devices used and patented which can be called an audio compressor. Each such device has some special attribute. Other names which have been used to describe compressors are: "automatic gain control" ("AGC"), "automatic volume control" ("AVC"), "complimiters", "levelers", and "gain reduction" devices.

Examples of objectives met by use of an audio compressor include: gaining loudness, increasing average modulation, improving audibility, reducing level variations, adding "punch", "fattening" sounds, getting a "bigger sound", getting more "slap", evening out speech density, and improving signal to noise ratio. Some objectives are basically problem solving while others include artistic or aesthetic considerations.

The many differing compressors of prior an have had specific qualities making them more suitable for a certain objective and less suitable for others. The suitability is a measure of how well a compressor device achieves the needed function and also how well it reserves the desired qualities of the sound. A compression device might be deemed unsuitable, for example, if it does keep levels more constant as required but as a byproduct it causes the sound to contain excessive distortion. For telephony, however, the same device may be fully suitable because the distortion may not be considered excessive.

The problems associated with designing an audio compressor which fulfills a wide range of objectives associated with the dynamic control of audio level while also maintaining a generally excellent audio quality are difficult to master and overcome. Many attempts have been made in prior art including multiband compressors, and compressors which have some form of "intelligence", i.e., some form of self adaptability to the audio program. However, it is still desirable to create a new audio compressor which can provide a more desirable and pleasing effect over a wide range and types of audio signals.

SUMMARY OF THE INVENTION

The present invention is a wave dependent compressor. The primary object of the present invention is to provide an audio compression device which uses multiple interactive layered time constants and a continuously variable compression ratio to create an easy to use audio compressor which self adapts to the characteristics of audio signals and provides a desirable and pleasing effect over a wide range of audio signals.

The present invention could be classed as a self adapting variation of an audio compressor. Its principles do not exclude the possibility of adaptation to a multiband compression system, but in the presently preferred embodiment it remains in the form of a single band, or wideband compressor. While the concept of self adaptation is not necessarily new, the specific methods and principles used to create a self adaptive compressor certainly constitute the material of invention, as is evidenced by the many patents issued for audio compressors. This is especially evident if a broad definition of self adaptation is used to include compressor devices which adapt without user interaction as a function of one or more characteristics of the audio program including, but not limited to, frequency, duration, peak factor, etc.

The present invention includes a means to adapt itself to the parameters of level, transiency, peak factor, and repetitiveness as will be further described in detail. Resulting from the principles of the present invention, an audio compressor is realized which finds a wide range of applications and has been found to supply an unusually good aesthetic audio quality based upon current musical preferences in the recording and broadcasting fields.

Described generally, the present invention is a wave dependent compressor comprising a voltage control amplifier connected between an input signal path and an output signal path, a detector connected to the output signal path for detecting the output signal and producing a detected signal, and an adaptable filter connected to the detector and operating with a multiplicity of interactive layered time constants.

The adaptable filter of the present invention audio compressor comprises a rectifying circuit connected to the detector for rectifying the detected signal and providing a rectified signal, a first resistor-capacitor circuit connected to the rectifying circuit and producing a charging/discharging voltage which is more dependent on a transient peak value of the rectified signal, and a second resistor-capacitor circuit working under the charging/discharging voltage of the first resistor/capacitor circuit for producing a charging/discharging voltage which is more dependent on an average value of the rectified signal. The second resistor-capacitor circuit includes a variable resistor for adjusting its charging/discharging rate. The second resistor-capacitor circuit is connected in series to the first resistor-capacitor circuit for providing a wave dependent control feedback signal to a control feedback signal back of the voltage control amplifier, where the wave dependent control feedback signal is instantaneously and continuously dependent upon both the average and the transient peak value of the rectified signal.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
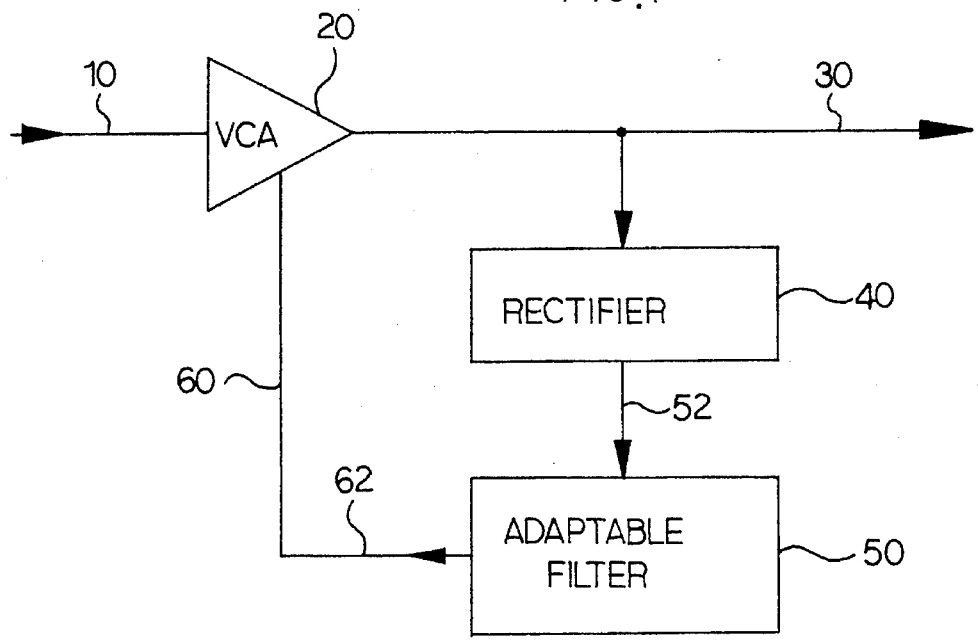
FIG. 1 is a block diagram of the present invention wave dependent compressor.

Referring to FIG. 1, there is shown a block diagram of the present invention wave dependent compressor. The present invention audio compressor comprises a voltage control amplifier ("VCA") 20 connected between an input signal path 10 and an output signal path 30, a detector 40, an adaptable filter 50, and a control feedback path 60 which is connected to the control input of VCA 20. The novel feature of the present invention is focused on the adaptable filter 50, and in the specific details of how the detector 40, the adaptable filter 50, and the VCA 20 combine to create the desired compressor action.

It is noted that the teachings of the present invention can be practiced with many different sets of component values. In addition, in the following description, reference to any specific time constant will be referenced only by the reference designation in the manner of R14·C9, for example.

Figure 2:
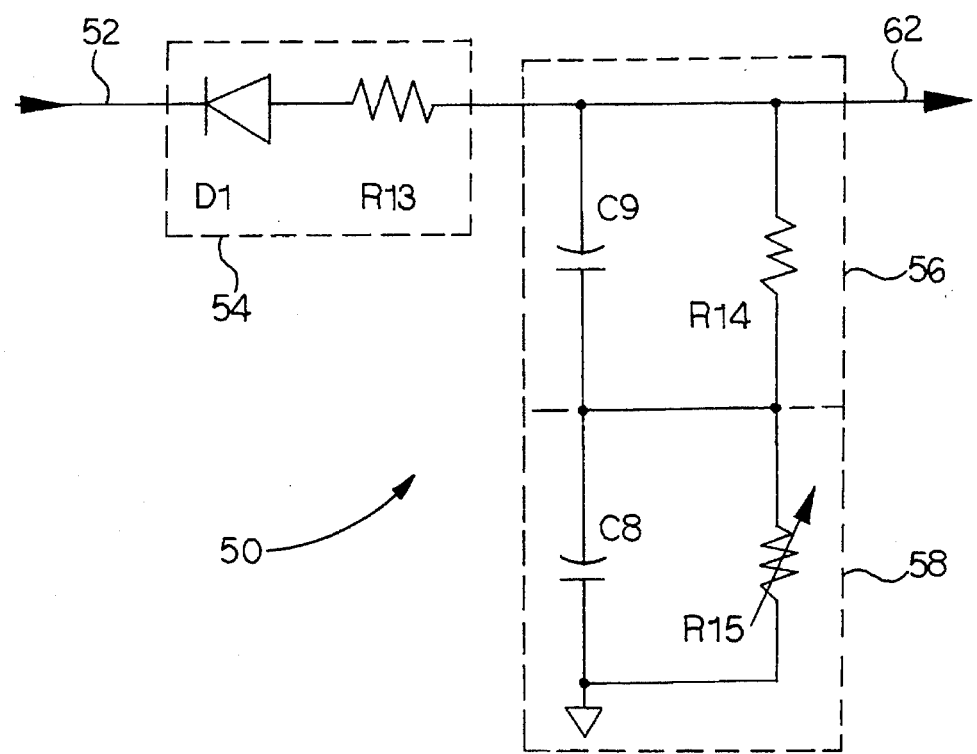
FIG. 2 is a detailed circuitry diagram showing the adaptable filter of the present invention wave dependent compressor.

Referring to FIG. 2, there is shown the details of the adaptable filter 50. It is noted that input 52 is connected to detector 40 as shown in FIG. 1, and that output path 62 is connected to control signal feedback path 60 also as shown in FIG. 1.

The adaptable filter 50 includes a rectifying circuit 54 and a resistor-capacitor ("RC") network of a first RC circuit 56, and a second RC circuit 58. The rectifying circuit includes a diode D1 and a first resistor R13. It should be noted that diode D1 is an element of this adaptable filter 50 and not necessarily an element of the detector 40. However, diode D1 may also be implemented as part of the detector 40. The purpose of diode D1 is to insure that current can flow in only one direction through R13. By way of example only, resistor R13 is 20 KΩ.

The first RC circuit 56 includes a first capacitor C9 and a second resistor R14 connected in parallel. By way of example only, first capacitor C9 is 1 μF, and second resistor R14 is 20 KΩ. The second RC circuit 58 includes a second capacitor C8 connected in series with first capacitor C9. The second RC circuit 58 further includes a variable resistor R15 which provides a means for adjusting its charging/discharging rate. By way of example only, second capacitor C8 is 4.7 μF, and variable resistor R15 ranges from 100 KΩ to 1 MΩ.

It can be seen that there are a multiple of time constants within the RC network of FIG. 2. By defining time constants as the product of a resistance and capacitance, there are the following operational RC products: R14·C9, R15·C9, (R13+R14)·C9, (R13+R14)·C8, R14·C8, and R15·C8. The rectified current from resistor R13 can be called the "charging current" since this current charges up the capacitors C9 and C8. The discharge path of capacitors C9 and C8 includes only resistors R14 and R15.

It is how capacitors C9 and C8 charge and discharge that is germane to the invention. Assuming a sufficiently large rectified audio signal is applied to diode D1, a current will flow through resistor R14 and capacitor C9. Several paths of current are possible. The resistors R14 and R15 will carry a current to ground directly, and capacitor C9 will pass current through resistor R15 and capacitor C8. Capacitor C8 receives a current through capacitor C9 and resistor R14. As the capacitors C9 and C8 build a charge, the current divides in different proportions among these paths. This is because of the asymptotic charging curve of a capacitor. Variable resistor R15 has a variable resistance which can be labeled "release time" because it has the effect of slowing down or speeding up the discharge of the stored voltage of adaptable filter 50.

It is noted that the circuit of FIG. 2 shows a specific polarity for diode D1. The polarity shown is for illustration only. It should be obvious that diode D1 can be reversed and the circuit will function identically except the polarity of the input and output voltages would be reversed. If capacitors C9 and C8 are implemented as polarized capacitor types, their polarization in the circuit can be properly arranged. For the purpose of illustration, the following description will rely on the polarity of diode D1 as shown in FIG. 2.

An analysis of the adaptive filter 50 is as follows. Assume all capacitors C9 and C8 are discharged, and a direct current ("DC") voltage is applied to diode D1. Capacitor C8 acts as a relatively slow charging filter, while capacitor C9 acts relatively fast. Since they are stacked in a series, the net filter output voltage is the sum of the voltages on capacitors C9 and C8. Capacitor C8 charges up from current brought down through the branch resistors R13 and R14, and also through the branch of resistor R13 and capacitor C9. Capacitor C8 charges initially faster through the branch of resistor R13 and capacitor C9 because capacitor C9 is accepting maximum charge and dumps a relatively large current through capacitor C8.

This rapidly adds a partial charge to capacitor C8, but the charging of capacitor C8 by the current through capacitor C9 is short lived since capacitor C9 rapidly charges to nearly the input voltage and its charging current then stops. If the input voltage is now removed, the output voltage of the adaptable filter 50 and will mainly be that developed across capacitor C9. If the input voltage remains longer, capacitor C8 will sustain further charging through the branch of resistors R13 and R14. This will be much slower than the initial charge of capacitor C8 by the charging current of capacitor C9. As the voltage charge of capacitor C8 rises, the total voltage across capacitors C1 and C2 will nearly equal the input voltage.

This does not bring a halt to charging currents, because capacitor C9 will begin to discharge through resistor R14 as the charge of capacitor C9 rises. There will be a transition period wherein the charge of capacitor C9 relatively slowly rises and the charge of capacitor C8 falls. Equilibrium will be reached when the voltage charges on capacitors C9 and C8 equal the voltage division of the ladder of resistors R13, R14 and R15. Since resistor R15 may have a variable resistance, the charge ratio of capacitors C9 and C8 may also be variable. The importance of this fact will become more apparent later in the description.

When the DC input voltage is removed from diode D1, capacitors C9 and C8 begin to discharge. The discharge paths of capacitors C9 and C8 tend to circulate through their parallel resistances of resistors R14 and R15, respectively, since the path up through resistor R13 is blocked by the reverse impedance of diode D1. The time constant of R14·C9 is much faster than that of R15·C8, so capacitor C9 can discharge relatively fast while capacitor C8 discharges more slowly.

Figure 3A:
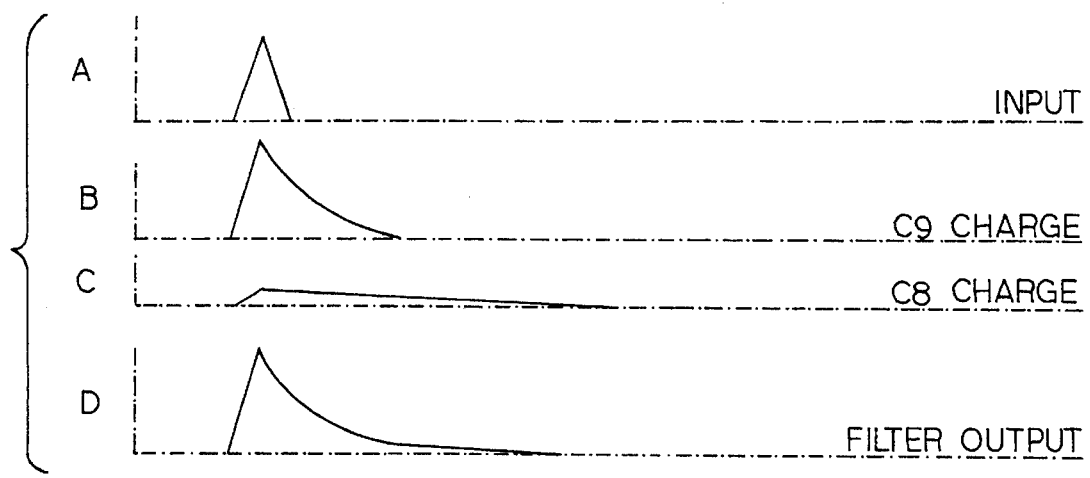
FIG. 3a is a waveform comparison diagram showing the convoluting effect of the adaptable filter of the present invention wave dependent compressor in response to a short transient input signal.
Figure 3B:
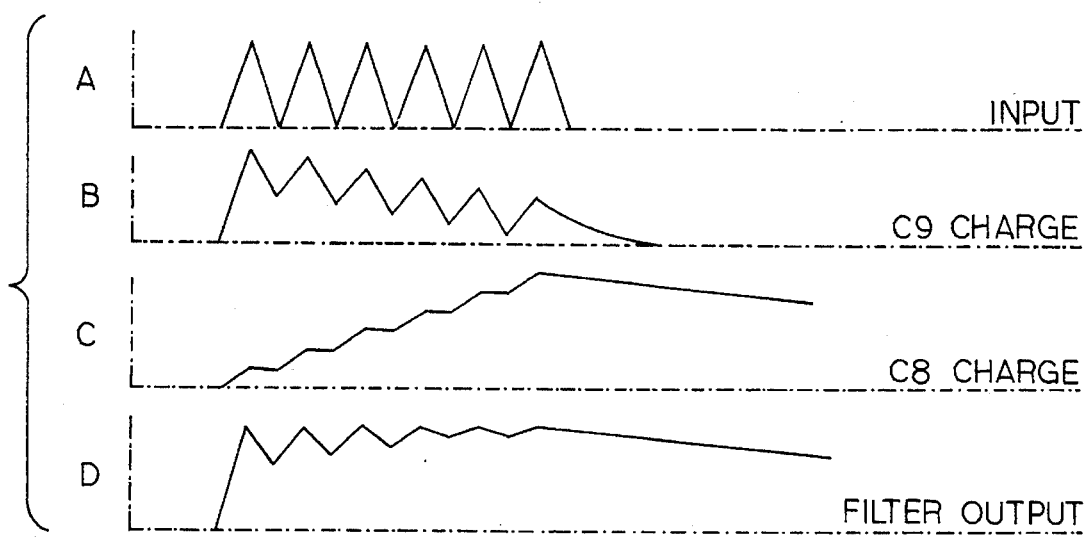
FIG. 3b is a waveform comparison diagram showing the convoluting effect of the adaptable filter of the present invention wave dependent compressor in response to a repeating series of short transient input signal.
Figure 3C:
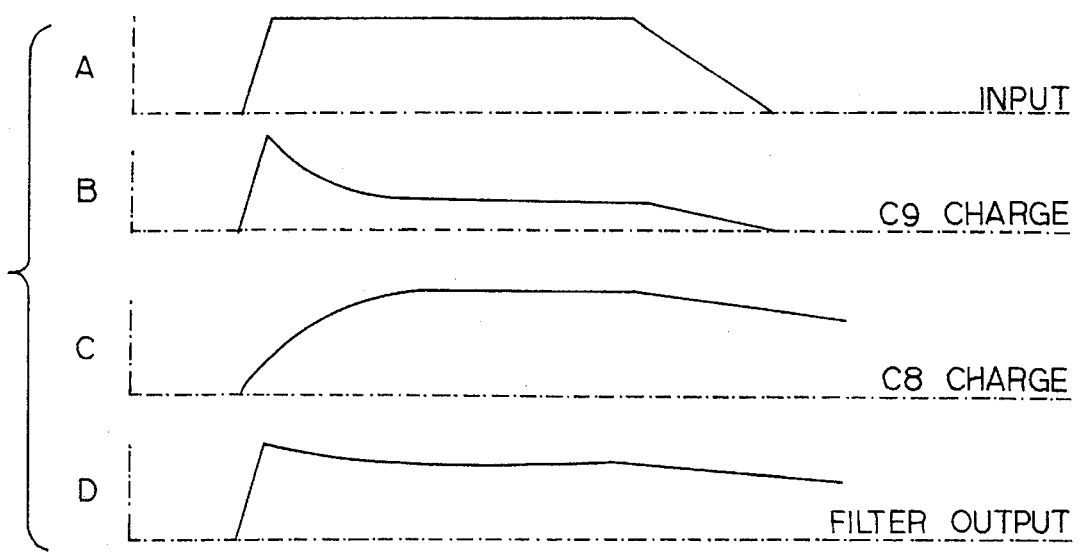
FIG. 3c is a waveform comparison diagram showing the convoluting effect of the adaptable filter of the present invention wave dependent compressor in response to a fairly steady input signal with a fast attack and decay characteristics.
Figure 3D:
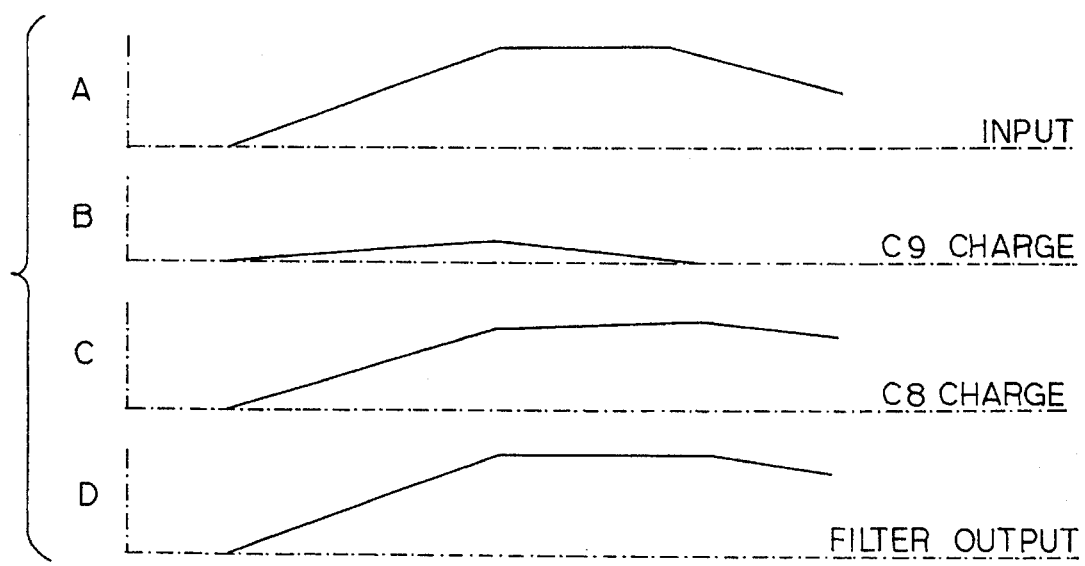
FIG. 3d is a waveform comparison diagram showing the convoluting effect of the adaptable filter of the present invention wave dependent compressor in response to a slow rising and fairly steady input signal.

Referring to FIGS. 3a through 3d, from the previously described relationships, several conditions can be stated which illustrate how the adaptable filter 50 reacts to different types of input signals:

1. If the input signal is a short transient, capacitor C9 will charge and discharge relatively fast with little charge going to capacitor C8. The output of the adaptable filter 50 will contain a fast rise and fall as illustrated in FIG. 3a.
2. If the input is a repeating series of short transients, capacitor C9 will first charge up then gradually charge and discharge at a proportionately lesser average voltage as capacitor C8 progressively builds up its charge. As shown in FIG. 3b, the output of the adaptable filter 50 will contain a fast attack but the output ripple will slowly diminish. Finally, the output will contain a relatively slow fall time.
3. If the input contains a fairly steady signal with a fast attack and decay, capacitor C9 at first attains a high charge, but subsequently its charge gives way to the charge which builds up on capacitor C8. As shown in FIG. 3c, the output of the adaptable filter 50 contains a fast rise followed by a slight fall to a steady value followed by a slow fall.
4. If the input is a slow rising and relatively steady signal, then capacitor C9 does not attain much charge because capacitor C8 can attain a charge fast enough through the branch of resistor R13 and resistor R14 to track the input rate of rise. The output of the adaptable filter as shown in FIG. 3d is basically that of the voltage on capacitor C8 alone with relatively little contribution from capacitor C9.

It was noted earlier that the value of resistor R15 would set the relative weight of charge on capacitor C9 and capacitor C8 by changing of the point of charge equilibrium. This fact means that the curves of FIG. 3 would be affected. To analyze the effects of all values of resistor R15 would be extremely tedious and unnecessary.

The most important observation is that as resistor R15 becomes smaller, the equilibrium point weighs the charge of capacitor C9 heavier and the filter output contains a higher portion of the capacitor C9 charge for the conditions of more sustained and less transient input signals. The consequence of this will be better understood after the further description of the adaptive filter to follow.

It can be generalized that the faster time constants related to capacitor C9 more closely follow the peaks of the input signal and the slower time constants related to capacitor C8 more closely follow the average of the input signal. Therefore, the output of the adaptable filter contains both average and peak following components which are interactive.

As was seen from FIGS. 3a through 3d, the output of the adaptive filter 50 acted mainly like a peak following filter for a single transient input. The adaptive filter 50 then transforms from peak following to average following for repetitive transient inputs. For a non-transient input, the adaptive filter 50 transforms from peak to average following if the input has a fast attack, as in FIG. 3c, but remains mainly an average follower if the non transient input has a slower attack, as in FIG. 3d.

The adaptive filter 50, therefore, is seen to adapt to the transient nature of the input signal, and to the input's average characteristics. The benefit of this action is in allowing the wave dependent compressor to react in the manner which is optimum for any audio signal. This statement is based upon the supposition that a transient signal sounds better if compressed fast time constants, allowing the compressor to effectively reduce the transient amplitude but not sustain the gain reduction long enough for the listener to notice a level reduction of the average sound level surrounding the transient peak.

The transient peaks which repeat at sufficient frequency should at first be compressed with a fast action but if their repeating pattern is sustained long enough, a slower averaging gain reduction would be desirable to prevent the listener from perceiving that the level of the average sounds surrounding the transients are modulated by the fast peak-flowing gain reduction. If the sounds are mainly non transient, the VCA control ripple should be minimized to reduce waveform distortion of the audio output. This requires generally slower filter averaging. It has been shown that the adaptive filter responses convolve to meet this various conditions.

Resistor R15 does not have to be made variable, and the present invention does not specify that it must be made so. However, it is sometimes desirable to allow the user to change the value of resistor R15 depending on the application. The effect of changing the value of resistor R15 does not negate the described convolution of the adaptive filter 50. However, it does change the discharge time of the average time constants. This directly affects the release time for non transient compression.

A faster release time constant caused by reducing the value of resistor R15 results in the compressor releasing faster, thus maintaining a higher average output level. Another consequence of reducing the value of resistor R15 is that of changing the relative charge equilibrium of capacitor C9 and capacitor C8.

When resistor R15 is smaller, the branch of resistor R13, resistor R14 and resistor R15 divides differently and a smaller proportion of the input voltage is developed at the capacitor C8 node. This makes capacitor C9 contain a larger relative charge and capacitor C8 a smaller relative charge when a sustained non-transient input signal is present as in the cases of FIG. 3c and 3d. Thus, not only is the average compression release made faster, but the transformation of peak following to average following is less complete. This leaves peak following more present in the VCA control, and the density of compression consequently increases.

This is a useful effect because the usual reason for speeding up the release time of a compressor is to gain greater compression density. Typically, however, the increased density so derived comes at the cost of a much more intense gain modulation effect causing transient peaks to audibly modulate the level of smaller signals. The present invention reduces this effect considerably by the combination of time constants and the tendency to convolve between peak and average following.

Figure 4:
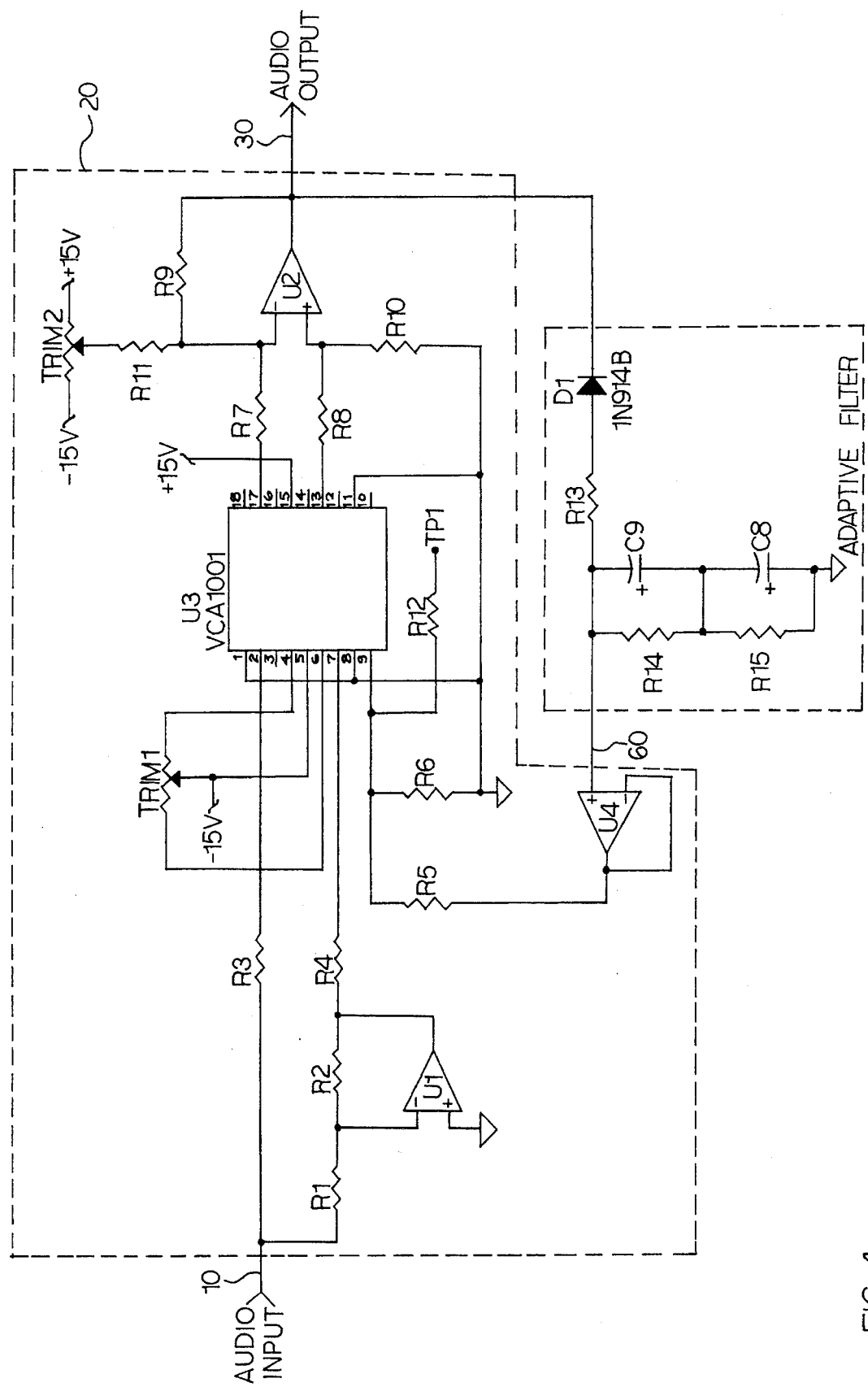
FIG. 4 is a detailed circuitry diagram of one embodiment of the present invention wave dependent compressor.

Referring to FIG. 4, a practical circuit illustrating the present invention is shown therein. This circuit can be implemented with any suitable type of operational amplifier ("opamp") for U1, U2, U4, and U5. A type of LF347 quad bifet opamp has been used in this circuit with good results. The device labeled U3 is a VCA chip available from Aphex Systems Ltd. of Sun Valley, Calif., and is designated as type number VCA1001.

The circuit correlates to the functions of FIG. 1 as follows. The VCA of FIG. 1 is represented in FIG. 4 by the combination of U1, through U4, and resistor R1 through resistor R12. These components form a practical VCA circuit with an audio input, an audio output, and a control input. The rectifier 40 of FIG. 1 is represented by diode D1 which serves as a half-wave rectifier. The function of D1 as both a rectifier and a reverse current blocker for the adaptive filter 50 is merely a point of efficient circuit design, and does not limit the present invention to this technique.

Figure 5:
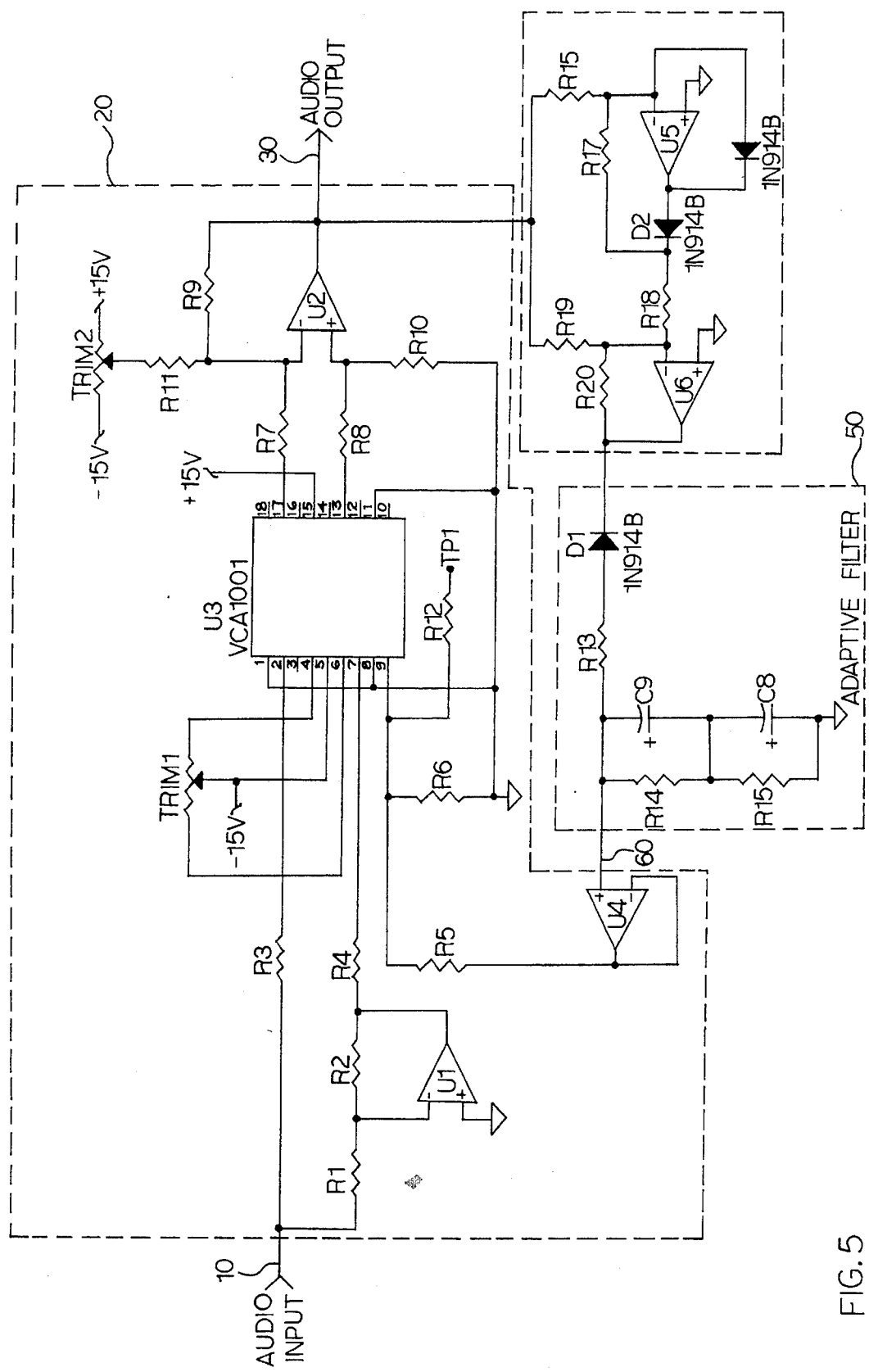
FIG. 5 is a detailed circuitry diagram of another embodiment of the present invention wave dependent compressor.

For example, a precision full wave rectifier could just as easily feed D1 divorcing D1 from the rectifier function, as shown in FIG. 5. In FIG. 5, the function of the rectifier 40 is supplied by the circuit of U5, U6, D2, D3, and resistor R16 through resistor R20. This will be recognized as a conventional "absolute value" or "precision full wave rectifier" circuit. With that one exception, the circuit of FIG. 5 operates exactly the same as that of FIG. 4.

Figure 6:
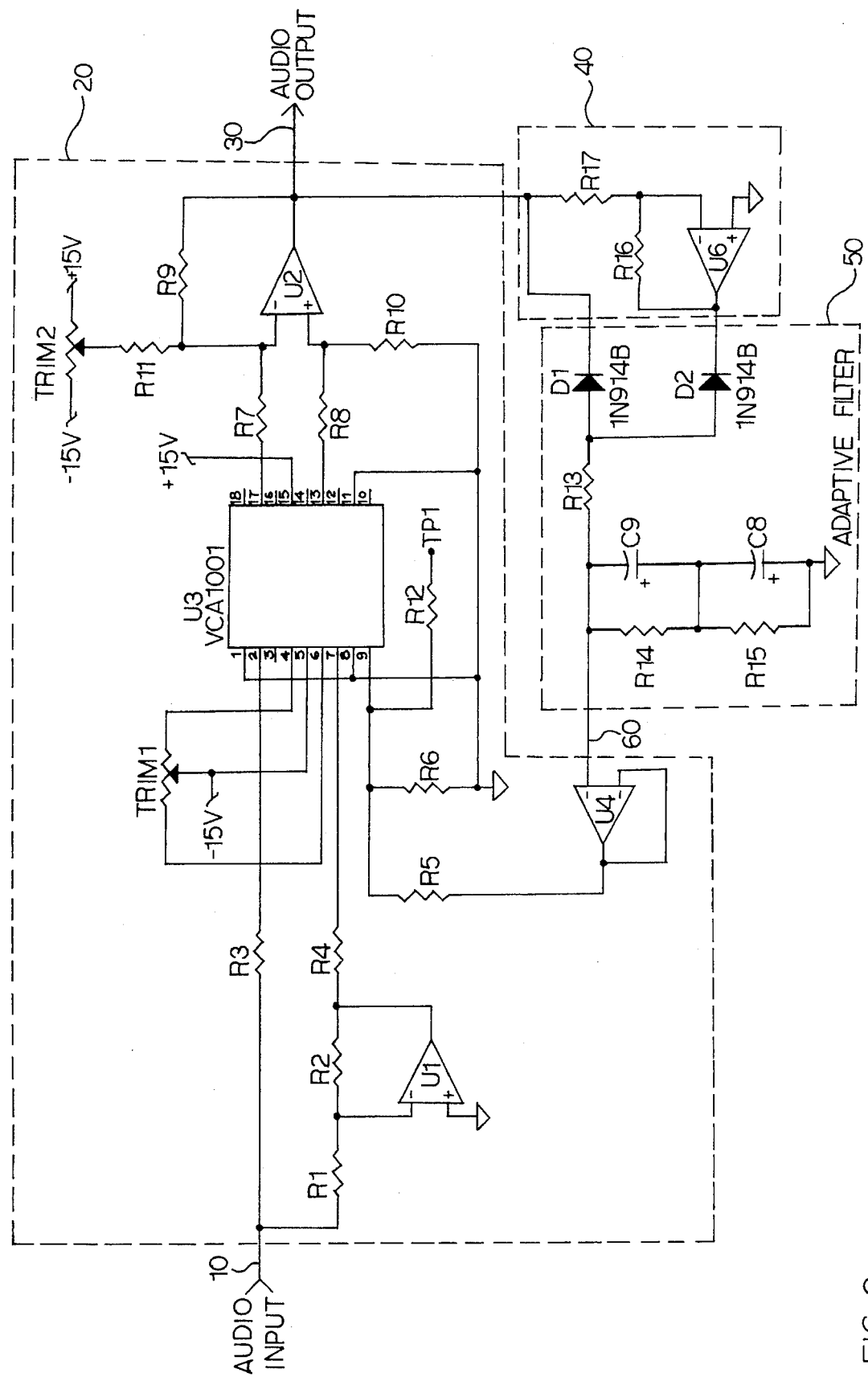
FIG. 6 is a detailed circuitry diagram of still another embodiment of the present invention wave dependent compressor.

FIG. 6 shows yet another variation of rectifier which could be used with the present invention. In that circuit, the function of the rectifier 40 is created by merely adding a phase invertor consisting of U5, resistor R17, and resistor R18. The invertor receives and inverts the VCA output to drive a second diode, D2. In FIG. 6, diode D2 serves a function equal to diode D1 and both diodes D1 and D2 can be said to coexist as a part of the adaptive filter and rectifier circuit. With that exception, the circuit of FIG. 6 operates exactly the same as that of FIG. 4.

Since FIGS. 5 and 6 differ from FIG. 4 only in the manner of the rectifier function, which functions are well known in the art, only the operation of the circuit of FIG. 4 will be described in further detail.

Completing the correlation between FIGS. 1 and 4, the function of VCA control feedback of FIG. 1 is provided in FIG. 4 by the connection of the output of the adaptive filter 50 to the VCA control input which can be considered to be the noninverting input of the high impedance buffer, U4. U4 should be considered as part of the VCA 20 since it has no particular significance to the adaptive filter 40 and merely lends a high input impedance to the VCA control input to avoid loading down the adaptive filter 50.

The wave dependent compressor circuit of FIG. 4, and therefore those of FIGS. 5 and 6, operates as follows. An audio signal is supplied to the VCA input 10. U1 acts as a phase invertor for the input signal. Pins 2 and 7, which are the two inputs of U3, receive two input currents 180 degrees out of phase. The two voltage outputs of U3, pins 13 and 17, feed a differential amplifier comprised of U2, and resistor R7 through resistor R11, which rejects the common mode output of U3 and renders the final VCA audio output signal 30. It can be said the output of U2 feeds diode D1 which acts as a half wave dependent compressor. The output of U2 feeds diode D1 which acts as a half wave rectifier. Negative half waves conducted through diode D1 generate the charging current of the adaptive filter 50, as previously described in great detail. The negative polarity of the control signal from the adaptive filter's output attenuates the VCA. A higher amplitude output from the VCA causes greater VCA attenuation. This produces an amplitude regulating effect, and due to the nature of the adaptive filter, a wave dependent compressor is created.

Details not pertinent to the present invention but necessary for the practical circuits of FIGS. 4 through 6 are two adjustments to balance out the type VCA1001 integrated circuit ("IC") for minimum control feedthrough and minimum DC offset. This is accomplished by applying a triangular waveform of about 100 Hz frequency with a peak amplitude of zero to −10 volts to the test point TP1. Adjust Trims 1 and 2 to obtain the lowest control feedthrough with an average offset of zero volts DC at the output of U2.

Defined in detail, the present invention is a wave dependent compressor, comprising: (a) an input signal path for receiving an input signal; (b) an output signal path for rendering an output signal; (c) a voltage control amplifier connected between said input signal path and said output signal path; (d) a rectifier connected to said output signal path for producing a rectified signal which is a rectified version of said output signal of said voltage control amplifier; (e) an adaptable filter connected to said rectifier and operating with a multiplicity of interactive layered time constants, the adaptable filter comprising a one-way current device connected to said rectifier for permitting said rectifier to charge the adaptable filter but preventing said rectifier from discharging the adaptable filter; (f) said adaptable filter further comprising a first resistor-capacitor circuit connected to said one-way current device and producing a charging/discharging voltage which is more dependent on a transient peak value of said rectified signal; (g) said adaptable filter further comprising a second resistor-capacitor circuit working under said charging/discharging voltage of said first resistor/capacitor circuit for producing a charging/discharging voltage which is more dependent on an average value of said rectified signal, the second resistor-capacitor circuit connected in series to said first resistor-capacitor circuit for providing a wave dependent control feedback signal which is instantaneously and continuously dependent upon both said average and said transient peak value of said rectified signal; and (h) a control feedback path connected between said adaptable filter and said voltage control amplifier for supplying said wave dependent control feedback signal to said voltage control amplifier to provide instantaneous and continuous gain control adjustment; (i) whereby said wave dependent compressor operates under said multiplicity of interactive layered time constants to create a self-adaptive compression over a wide range of said input signal and therefore provides said output signal with an instantaneous and continuous gain control.

Defined broadly, the present invention is an improvement of utilizing an adaptable filter in an audio compressor having a voltage control amplifier connected between an input signal path and an output signal path, the adaptable filter comprising: (a) a rectifying circuit connected to said output signal path for providing a rectified signal, the rectifying circuit including a diode and a first resistor connected in series; (b) a first resistor-capacitor circuit connected to said rectifying circuit and including a first capacitor and a second resistor connected in parallel and producing a charging/discharging voltage which is more dependent on a transient peak value of said rectified signal; (c) a second resistor-capacitor circuit including a second capacitor working under said charging/discharging voltage of said first resistor/capacitor circuit for producing a charging/discharging voltage which is more dependent on an average value of said rectified signal; (d) said second resistor-capacitor circuit further including a variable resistor for adjusting its charging/discharging rate; (e) said second resistor-capacitor circuit connected in series to said first resistor-capacitor circuit for providing a wave dependent control feedback signal which is instantaneously and continuously dependent upon both said average and said transient peak value of said rectified signal; and (f) a control feedback path connected between said adaptable filter and said voltage control amplifier for supplying said wave dependent control feedback signal to said voltage control amplifier to provide instantaneous and continuous gain control adjustment; (g) whereby said adaptable filter operates under said multiplicity of interactive layered time constants to create a self-adaptive compression over a wide range of said rectified signal and therefore provides said audio compressor with an instantaneous and continuous gain control.

Defined more broadly, the present invention is an adaptable filter connected between an output signal path and a control feedback signal path of a voltage control amplifier, the adaptable filter comprising: (a) a first resistor-capacitor circuit connected to said output signal path and producing a charging/discharging voltage which is more dependent on a transient peak value of an output signal of said voltage control amplifier; (b) a second resistor-capacitor circuit working under said charging/discharging voltage of said first resistor/capacitor circuit for producing a charging/discharging voltage which is more dependent on an average value of said output signal; and (c) said second resistor-capacitor circuit connected in series to said first resistor-capacitor circuit for providing a wave dependent control feedback signal to said control feedback signal path which feedback signal is instantaneously and continuously dependent upon both said average and said transient peak value of said output signal; (d) whereby said adaptable filter operates under said multiplicity of interactive layered time constants to create a self-adaptive compression over a wide range of audio signals and therefore provides said voltage control amplifier with an instantaneous and continuous gain control.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A wave dependent compressor, comprising:
   a. an input signal path for receiving an input signal;
   b. an output signal path for rendering an output signal;
   c. a voltage control amplifier connected between said input signal path and said output signal path;
   d. a rectifier connected to said output signal path for producing a rectified signal which is a rectified version of said output signal of said voltage control amplifier;
   e. an adaptable filter connected to said rectifier and operating with a multiplicity of interactive layered time constants, the adaptable filter comprising a one-way current device connected to said rectifier for permitting said rectifier to charge the adaptable filter but preventing said rectifier from discharging the adaptable filter;
   f. said adaptable filter further comprising a first resistor-capacitor circuit connected to said one-way current device and producing a charging/discharging voltage which is more dependent on a transient peak value of said rectified signal than it is on an average value of said rectified signal;
   g. said adaptable filter further comprising a second resistor-capacitor circuit to which said charging/discharging voltage of said first resistor/capacitor circuit is applied for producing a charging/discharging voltage which is more dependent on said average value of said rectified signal than it is on said transient peak value of said rectified signal, the second resistor-capacitor circuit connected in series to said first resistor-capacitor circuit for providing a wave dependent control feedback signal which is instantaneously and continuously dependent upon both said average and said transient peak value of said rectified signal; and
   h. a control feedback path connected between said adaptable filter and said voltage control amplifier for supplying said wave dependent control feedback signal to said voltage control amplifier to provide instantaneous and continuous gain control adjustment;
   i. whereby said wave dependent compressor operates under said multiplicity of interactive layered time constants to create a self-adaptive compression over a wide range of said input signal and therefore provides said output signal with an instantaneous and continuous gain control.

2. The invention as defined in claim 1 wherein said one-way current device of said adaptable filter includes a diode and a first resistor connected in series.

3. The invention as defined in claim 2 wherein said first resistor has a resistance of 20 KΩ.

4. The invention as defined in claim 1 wherein said first resistor-capacitor circuit of said adaptable filter includes a first capacitor and a second resistor connected in parallel.

5. The invention as defined in claim 4 wherein said first capacitor has a capacitance of 1 μF.

6. The invention as defined in claim 4 wherein said second resistor has a resistance of 20 KΩ.

7. The invention as defined in claim 4 wherein said second resistor-capacitor circuit of said adaptable filter includes a second capacitor connected in series to said first capacitor.

8. The invention as defined in claim 7 wherein said second capacitor has a capacitance of 4.7 μF.

9. The invention as defined in claim 7 further comprising means for adjusting the charging/discharging rate of said second resistor-capacitor circuit of said adaptable filter.

10. The invention as defined in claim 9 wherein said means for adjusting the charging/discharging rate of said second resistor-capacitor circuit of said adaptable filter includes a variable resistor connected in parallel with said second capacitor.

11. The invention as defined in claim 10 wherein said variable resistor has a resistance within a range from 100 KΩ to 1 MΩ.

12. The invention as defined in claim 1 wherein said second resistor-capacitor circuit of said adaptable filter is grounded.

13. In an audio compressor having a voltage control amplifier connected between an input signal path and an output signal path, the improvement of utilizing an adaptable filter comprising:
   a. rectifying circuit connected to said output signal path for providing a rectified signal, the rectifying circuit including a diode and a first resistor connected in series;
   b. a first resistor-capacitor circuit connected to said rectifying circuit and including a first capacitor and a second resistor connected in parallel and producing a charging/discharging voltage which is more dependent on a transient peak value of said rectified signal than it is on an average value of said rectified signal;

c. a second resistor-capacitor circuit including a second capacitor to which said charging/discharging voltage of said first resistor/capacitor circuit is applied for producing a charging/discharging voltage which is more dependent on said average value of said rectified signal than it is on said transient peak value of said rectified signal;

d. said second resistor-capacitor circuit further including a variable resistor for adjusting its charging/discharging rate;

e. said second resistor-capacitor circuit connected in series to said first resistor-capacitor circuit for providing a wave dependent control feedback signal which is instantaneously and continuously dependent upon both said average and said transient peak value of said rectified signal; and f. a control feedback path connected between said adaptable filter and said voltage control amplifier for supplying said wave dependent control feedback signal to said voltage control amplifier to provide instantaneous and continuous gain control adjustment;

g. whereby said adaptable filter operates under said multiplicity of interactive layered time constants to create a self-adaptive compression over a wide range of said rectified signal and therefore provides said audio compressor with an instantaneous and continuous gain control.

14. The invention as defined in claim 13 further comprising a rectifier connected to said output signal path for producing a rectified signal which is a rectified version of said output signal of said voltage control amplifier.

15. The invention as defined in claim 14 wherein said first resistor has a resistance of 20 KΩ.

16. The invention as defined in claim 13 wherein said first capacitor has a capacitance of 1 µF.

17. The invention as defined in claim 13 wherein said second resistor has a resistance of 20 KΩ.

18. The invention as defined in claim 13 wherein said second capacitor has a capacitance of 4.7 µF.

19. The invention as defined in claim 13 wherein said variable resistor has a resistance within a range from 100 KΩ to 1 MΩ.

20. The invention as defined in claim 13 wherein said second resistor-capacitor circuit of said adaptable filter is grounded.

21. An adaptable filter connected between an output signal path and a control feedback signal path of a voltage control amplifier, the adaptable filter comprising:

a. a first resistor-capacitor circuit connected to said output signal path and producing a charging/discharging voltage which is more dependent on a transient peak value of an output signal of said voltage control amplifier than it is on an average value of the output signal, wherein the first resistor-capacitor circuit includes a first capacitor;

b. a second resistor-capacitor circuit to which said charging/discharging voltage of said first resistor/capacitor circuit is applied for producing a charging/discharging voltage which is more dependent on said average value of said output signal than it is on said transient peak value of said output signal, wherein the second resistor-capacitor circuit includes a second capacitor connected in series to said first capacitor; and c. said second resistor-capacitor circuit connected in series to said first resistor-capacitor circuit for providing a wave dependent control feedback signal to said control feedback signal path which feedback signal is instantaneously and continuously dependent upon both said average and said transient peak value of said output signal;

d. whereby said adaptable filter operates under said multiplicity of interactive layered time constants to create a self-adaptive compression over a wide range of audio signals and therefore provides said voltage control amplifier with an instantaneous and continuous gain control.

22. The invention as defined in claim 21 further comprising a rectifier connected to said output signal path for producing a rectified signal which is a rectified version of said output signal of said voltage control amplifier.

23. The invention as defined in claim 22 wherein said adaptable filter further comprises a one-way current device connected to said rectifier for permitting said rectifier to charge the adaptable filter but preventing said rectifier from discharging the adaptable filter.

24. The invention as defined in claim 23 wherein said one-way current device includes a diode and a first resistor connected in series.

25. The invention as defined in claim 24 wherein said first resistor has a resistance of 20 KΩ.

26. The invention as defined in claim 21 wherein said first resistor-capacitor circuit further includes a second resistor connected in parallel with said first capacitor.

27. The invention as defined in claim 26 wherein said first capacitor has a capacitance of 1 µF.

28. The invention as defined in claim 26 wherein said second resistor has a resistance of 20 KΩ.

29. The invention as defined in claim 21 wherein said second capacitor has a capacitance of 4.7 µF.

30. The invention as defined in claim 21 wherein said second resistor-capacitor circuit further comprises means for adjusting its charging/discharging rate.

31. The invention as defined in claim 30 wherein said means for adjusting the charging/discharging rate of said second resistor-capacitor circuit includes a variable resistor connected in parallel with said second capacitor.

32. The invention as defined in claim 31 wherein said variable resistor has a resistance within a range from 100 KΩ to 1 MΩ.

33. The invention as defined in claim 21 wherein said second resistor-capacitor circuit of said adaptable filter is grounded.

* * * * *